United States Patent
Lee et al.

(10) Patent No.: US 10,941,758 B2
(45) Date of Patent: Mar. 9, 2021

(54) LINEAR COMPRESSOR AND METHOD FOR MANUFACTURING A LINEAR COMPRESSOR

(71) Applicant: LG ELECTRONICS INC., Seoul (KR)

(72) Inventors: Kyeongweon Lee, Seoul (KR); Donghan Kim, Seoul (KR); Byungju Kim, Seoul (KR); Byunghoon Woo, Seoul (KR); Wonhyun Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 512 days.

(21) Appl. No.: 15/496,214

(22) Filed: Apr. 25, 2017

(65) Prior Publication Data

US 2017/0321673 A1    Nov. 9, 2017

(30) Foreign Application Priority Data

May 3, 2016    (KR) .................. 10-2016-0054901

(51) Int. Cl.
*F04B 39/00*    (2006.01)
*F04B 35/04*    (2006.01)
*F04B 27/08*    (2006.01)
*F04B 39/02*    (2006.01)
*F04B 53/14*    (2006.01)
(Continued)

(52) U.S. Cl.
CPC .......... *F04B 39/0005* (2013.01); *C23C 28/32* (2013.01); *C23C 28/343* (2013.01);
(Continued)

(58) Field of Classification Search
CPC .... F04B 39/0005; F04B 39/10; F04B 35/045; F04B 39/123; F04B 39/121;
(Continued)

(56) References Cited

U.S. PATENT DOCUMENTS 4,414,276 A * 11/1983 Kiriyama .............. B01F 5/0604
                                                    264/167
6,078,425 A *  6/2000 Wolfe et al. .......... G02B 1/105
                                                    359/584
(Continued)

FOREIGN PATENT DOCUMENTS

CN        1743503        3/2006
CN      101665940        3/2010
(Continued)

OTHER PUBLICATIONS

English machine translation of JP2002194565.*
(Continued)

*Primary Examiner* — Peter J Bertheaud
(74) *Attorney, Agent, or Firm* — Ked & Associates LLP

(57) ABSTRACT

A linear compressor and a method for manufacturing a linear compressor are provided. A piston of a linear compressor may include a surface treatment body made of aluminum or an aluminum alloy; a first surface treatment provided on an outer surface of the surface treatment body by a first vacuum deposition process; and a second surface treatment provided on an outer surface of the first surface treatment by a second vacuum deposition process.

16 Claims, 12 Drawing Sheets

(51) Int. Cl.
| | |
|---|---|
| *F04B 39/12* | (2006.01) |
| *F16J 1/01* | (2006.01) |
| *C23C 28/00* | (2006.01) |
| *F04B 39/10* | (2006.01) |
| *C23C 14/14* | (2006.01) |
| *C23C 14/34* | (2006.01) |
| *C23C 16/27* | (2006.01) |
| *C23C 16/50* | (2006.01) |

(52) U.S. Cl.
CPC ........ *F04B 27/0878* (2013.01); *F04B 35/045* (2013.01); *F04B 39/0016* (2013.01); *F04B 39/0276* (2013.01); *F04B 39/10* (2013.01); *F04B 39/12* (2013.01); *F04B 39/121* (2013.01); *F04B 53/14* (2013.01); *F16J 1/01* (2013.01); *C23C 14/14* (2013.01); *C23C 14/34* (2013.01); *C23C 16/27* (2013.01); *C23C 16/50* (2013.01); *F05C 2201/021* (2013.01); *F05C 2251/10* (2013.01); *F05C 2253/12* (2013.01)

(58) Field of Classification Search
CPC .......... F04B 39/1073; F04B 35/04–045; F04B 39/12–122; F04B 39/126; F04B 53/008–02; F04B 53/14; F04B 53/16–168; F04B 39/0016; F04B 27/0878; F04B 39/0276; C23C 16/50; C23C 16/27; C23C 14/34; C23C 14/14; C23C 28/32; C23C 28/343; F16J 1/01; F05C 2253/12; F05C 2201/021; F05C 2251/10
USPC ........ 417/415–417, 545, 559, 567, 569–572, 417/902
See application file for complete search history.

(56) References Cited

U.S. PATENT DOCUMENTS

| | | | | |
|---|---|---|---|---|
| 6,752,332 | B1* | 6/2004 | Terakado et al. | F02M 51/0667 239/585.1 |
| 8,172,557 | B2* | 5/2012 | Hilger | F04B 25/00 417/569 |
| 2008/0213115 | A1 | 9/2008 | Hilger et al. | |
| 2009/0238701 | A1 | 9/2009 | Giacchi et al. | |
| 2012/0237371 | A1* | 9/2012 | Taguchi | F04B 27/1804 417/313 |
| 2015/0004021 | A1* | 1/2015 | Kang | F04B 35/045 417/410.1 |
| 2015/0004025 | A1* | 1/2015 | Kang | F04B 49/225 417/415 |
| 2016/0369736 | A1* | 12/2016 | Heau | F02F 1/004 |

FOREIGN PATENT DOCUMENTS

| | | |
|---|---|---|
| CN | 101983256 | 3/2011 |
| CN | 102092166 | 6/2011 |
| CN | 102460037 | 5/2012 |
| CN | 103225064 | 7/2013 |
| CN | 103608482 | 2/2014 |
| CN | 104251190 | 12/2014 |
| CN | 104271929 | 1/2015 |
| CN | 105298793 | 2/2016 |
| EP | 0 838 590 | 4/1998 |
| JP | 2000-219545 | 10/2000 |
| JP | 2002194565 * | 7/2002 |
| JP | 2008-031544 | 2/2008 |
| JP | 2011-017269 | 1/2011 |
| KR | 104307688 | 9/2013 |
| KR | 10-2016-0000302 | 1/2016 |
| KR | 10-2016-0000324 | 1/2016 |

OTHER PUBLICATIONS

Chinese Office Action dated Sep. 5, 2018 with English Translation.
European Search Report dated Oct. 6, 2017.
Chinese Office Action dated Sep. 25, 2019 issued in Application No. 201710221045.5 (English translation attached).
Korean Office Action dated Oct. 23, 2020 issued in Application No. 10-2016-0054901.

* cited by examiner

LINEAR COMPRESSOR AND METHOD FOR MANUFACTURING A LINEAR COMPRESSOR

CROSS-REFERENCE TO RELATED APPLICATION(S)

The present application claims priority under 35 U.S.C. 119 and 35 U.S.C. 365 to Korean Patent Application No. 10-2016-0054901, filed in Korea on May 3, 2016, which is hereby incorporated by reference in its entirety.

BACKGROUND

1. Field

A linear compressor and a method for manufacturing a linear compressor is disclosed herein.

2. Background

Cooling systems are systems in which a refrigerant circulates to generate cool air. In such a cooling system, processes of compressing, condensing, expanding, and evaporating the refrigerant are repeatedly performed. For this, the cooling system includes a compressor, a condenser, an expansion device, and an evaporator. Also, the cooling system may be installed in a refrigerator or air conditioner which is a home appliance.

In general, compressors are machines that receive power from a power generation device, such as an electric motor or a turbine, to compress air, a refrigerant, or various working gases, thereby increasing pressure. Compressors are being widely used in home appliances or industrial fields.

Compressors may be largely classified into reciprocating compressors, in which a compression space into/from which a working gas is suctioned and discharged, is defined between a piston and a cylinder to allow the piston to be linearly reciprocated into the cylinder, thereby compressing a refrigerant, rotary compressors, in which a compression space into/from which a working gas is suctioned or discharged, is defined between a roller that eccentrically rotates and a cylinder to allow the roller to eccentrically rotate along an inner wall of the cylinder, thereby compressing a refrigerant, and scroll compressors, in which a compression space into/from which a refrigerant is suctioned or discharged, is defined between an orbiting scroll and a fixed scroll to compress a refrigerant while the orbiting scroll rotates along the fixed scroll. In recent years, a linear compressor, which is directly connected to a drive motor, in which a piston linearly reciprocates, to improve compression efficiency without mechanical losses due to movement conversion, and having a simple structure, is being widely developed. In general, the linear compressor may suction and compress a refrigerant while a piston linearly reciprocates in a sealed shell by a linear motor and then discharge the refrigerant.

The linear motor is configured to allow a permanent magnet to be disposed between an inner stator and an outer stator. The permanent magnet may linearly reciprocate by an electromagnetic force between the permanent magnet and the inner (or outer) stator. Also, as the permanent magnet operates in the state in which the permanent magnet is connected to the piston, the permanent magnet may suction and compress the refrigerant while linearly reciprocating within the cylinder and then discharge the refrigerant.

The present applicant has filed a patent (hereinafter, referred to as "Prior Art Document 1") and then has registered the patent with respect to the linear compressor, Korean Patent Registration No. 10-1307688, registered on Sep. 5, 2013 and entitled "LINEAR COMPRESSOR", which is hereby incorporated by reference. The linear compressor according to the Prior Art Document 1 includes a shell for accommodating a plurality of parts. A vertical height of the shell may be somewhat high as illustrated in FIG. 2 of the Prior Art Document 1. Also, an oil supply assembly for supplying oil between a cylinder and a piston may be disposed within the shell.

When the linear compressor is provided in a refrigerator, the linear compressor may be disposed in a machine room provided at a rear side of the refrigerator. In recent years, a major concern of a customer is increasing an inner storage space of the refrigerator. To increase the inner storage space of the refrigerator, it may be necessary to reduce a volume of the machine room. Also, to reduce the volume of the machine room, it may be important to reduce a size of the linear compressor.

However, as the linear compressor disclosed in the Prior Art Document 1 has a relatively large volume, it is necessary to increase a volume of a machine room into which the linear compressor is accommodated. Thus, the linear compressor having a structure disclosed in the Prior Art Document 1 is not adequate for the refrigerator for increasing the inner storage space thereof.

To reduce the size of the linear compressor, it may be necessary to reduce a size of a main part or component of the compressor. In this case, performance of the compressor may deteriorate. To compensate for the deteriorated performance of the compressor, the compressor drive frequency may be increased. However, the more the drive frequency of the compressor is increased, the more a friction force due to oil circulating into the compressor increases, deteriorating performance of the compressor.

To solve these limitations, the present applicant has filed a patent application (hereinafter, referred to as "Prior Art Document 2"), Korean Patent Publication No. 10-2016-0000324 published on Jan. 4, 2016, and entitled "LINEAR COMPRESSOR", which is hereby incorporated by reference. In the linear compressor of the Prior Art Document 2, a gas bearing technology in which a refrigerant gas is supplied in a space between a cylinder and a piston to perform a bearing function is disclosed. The refrigerant gas flows to an outer circumferential surface of the piston through a nozzle of the cylinder to act as a bearing in the reciprocating piston.

The method for manufacturing the linear compressor according to the Prior Art Document 2 includes forming a buffer part or buffer on an outer circumferential surface of a piston, polishing a surface of the buffer part, and forming a piston surface treatment part on the polished surface of the buffer part. According to the manufacturing method of the Prior Art Document 2, a first process of forming the buffer part and a second process of forming the piston surface treatment part are performed by different methods and apparatuses. It is usual that a company that performs the first process is different from a company that performs the second process.

Therefore, in the case of manufacturing the linear compressor by the manufacturing method of the Prior Art Document 2, after an outer appearance of the piston is formed, the first process is performed thereon and the piston is packaged again. Then, the piston is transferred to the company for the second process while spending logistical cost. The first process involves a relatively high cost. As a result, the manufacturing cost of the linear compressor increases.

Also, according to the manufacturing method of the Prior Art Document 2, since a process of polishing the relatively rough surface of the buffer part needs to be additionally performed after the first process, the manufacturing cost increases as much. When an error occurs in the polishing process, it may be difficult to achieve a desired surface treatment performance of the piston. If the desired surface treatment performance of the piston is not achieved, in particular, a friction occurs between the piston and the cylinder when gas bearing performance is not sufficiently exhibited during the operation of the linear compressor, in particular, during an initial operation of the linear compressor, thus causing abrasion in the piston.

BRIEF DESCRIPTION OF THE DRAWINGS

Embodiments will be described in detail with reference to the following drawings in which like reference numerals refer to like elements, and wherein.

DETAILED DESCRIPTION

Hereinafter, embodiments will be described with reference to the accompanying drawings. The embodiments may, however, be embodied in many different forms and should not be construed as being limited to the embodiments set forth herein; rather, that alternate embodiments included in other retrogressive inventions or falling within the spirit and scope will fully convey the concept to those skilled in the art.

Figure 1:
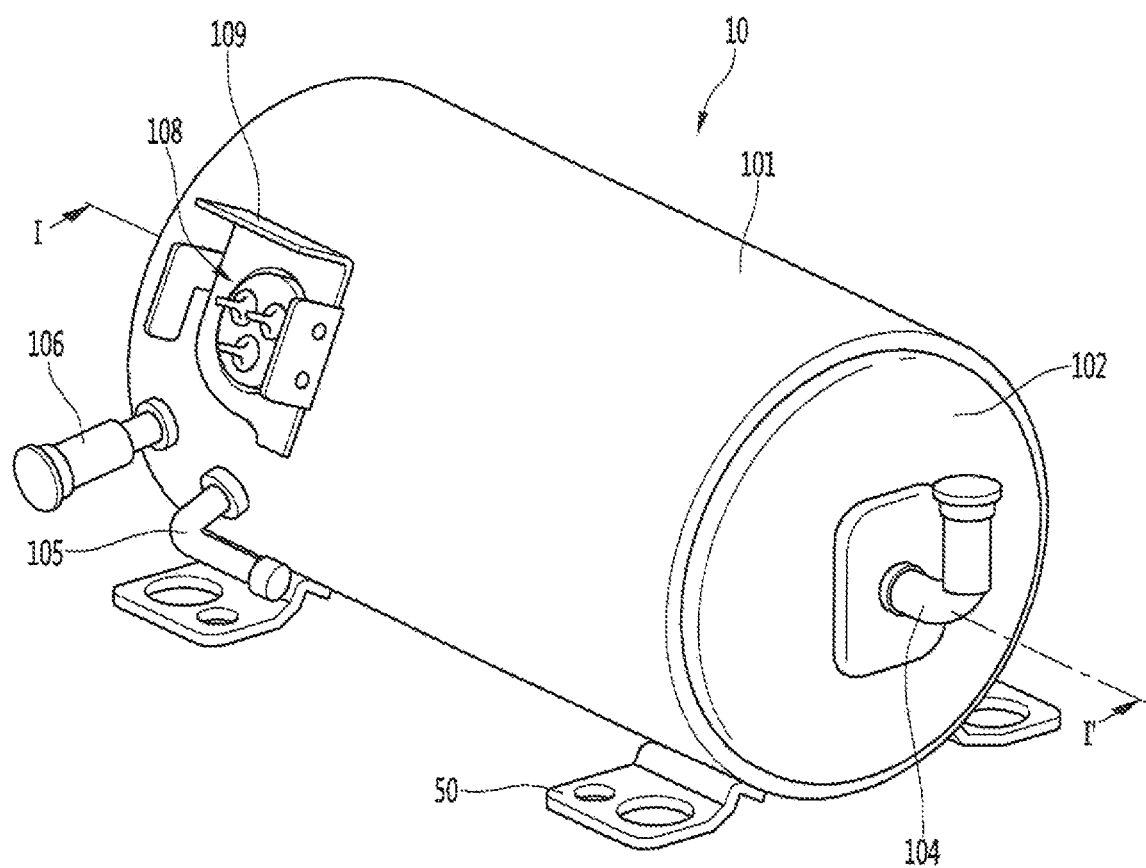
FIG. 1 is a perspective view illustrating an outer appearance of a linear compressor according to an embodiment.
Figure 2:
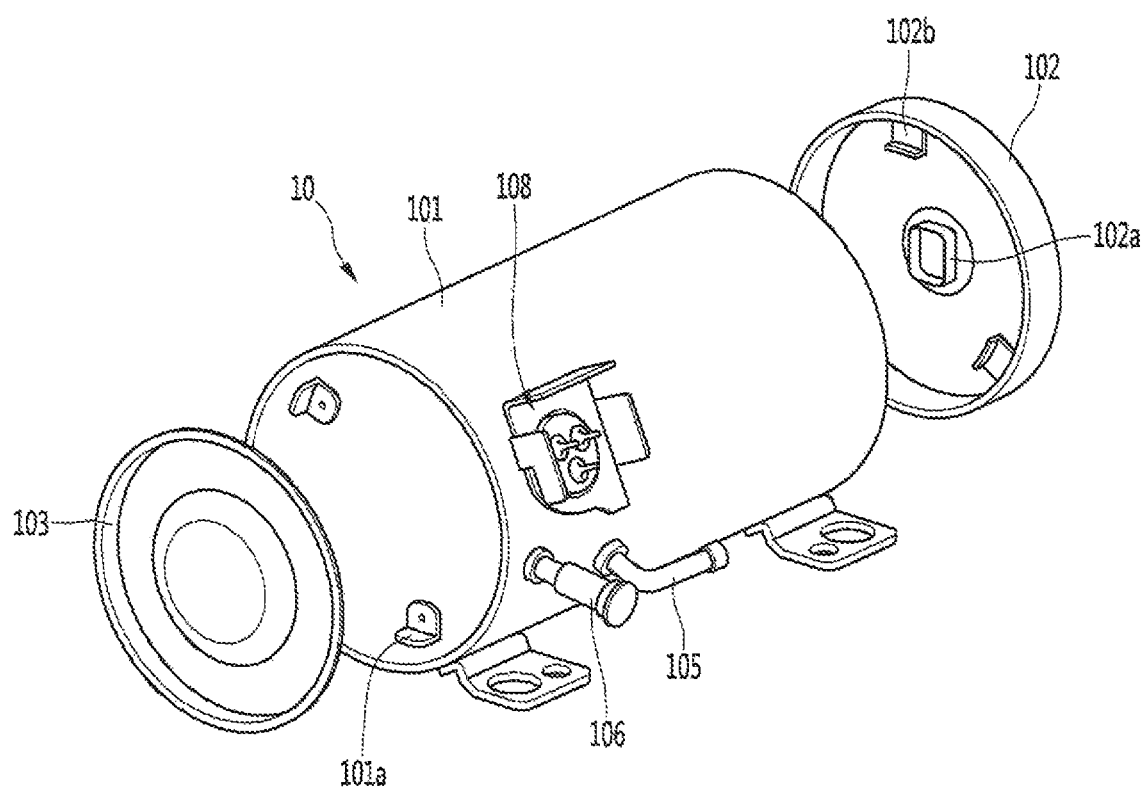
FIG. 2 is an exploded perspective view of a shell and a shell cover of the linear compressor according to an embodiment.

FIG. 1 is a perspective view illustrating an outer appearance of a linear compressor according to an embodiment. FIG. 2 is an exploded perspective view illustrating a shell and a shell cover of the linear compressor according to an embodiment.

Referring to FIGS. 1 and 2, a linear compressor 10 according to an embodiment may include a shell 101 and shell covers 102 and 103 coupled to the shell 101. Each of the first and second shell covers 102 and 103 may be understood as one component of the shell 101.

A leg 50 may be coupled to a lower portion of the shell 101. The leg 50 may be coupled to a base of a product in which the linear compressor 10 is installed or provided. For example, the product may include a refrigerator, and the base may include a machine room base of the refrigerator. For another example, the product may include an outdoor unit of an air conditioner, and the base may include a base of the outdoor unit.

The shell 101 may have an approximately cylindrical shape and be disposed to lie in a horizontal direction or an axial direction. In FIG. 1, the shell 101 may extend in the horizontal direction and have a relatively low height in a radial direction. That is, as the linear compressor 10 has a low height, when the linear compressor 10 is installed or provided in the machine room base of the refrigerator, a machine room may be reduced in height.

A terminal 108 may be installed or provided on an outer surface of the shell 101. The terminal 108 may be understood as a component for transmitting external power to a motor assembly (see reference numeral 140 of FIG. 3) of the linear compressor 10. The terminal 108 may be connected to a lead line of a coil (see reference numeral 141c of FIG. 3).

A bracket 109 may be installed or provided outside of the terminal 108. The bracket 109 may include a plurality of brackets that surrounds the terminal 108. The bracket 109 may protect the terminal 108 against an external impact.

Both sides of the shell 101 may be open. The shell covers 102 and 103 may be coupled to both open sides of the shell 101. The shell covers 102 and 103 may include a first shell cover 102 coupled to one open side of the shell 101 and a second shell cover 103 coupled to the other open side of the shell 101. An inner space of the shell 101 may be sealed by the shell covers 102 and 103.

In FIG. 1, the first shell cover 102 may be disposed at a first or right portion of the linear compressor 10, and the second shell cover 103 may be disposed at a second or left portion of the linear compressor 10. That is, the first and second shell covers 102 and 103 may be disposed to face each other.

The linear compressor 10 further includes a plurality of pipes 104, 105, and 106 provided in the shell 101 or the shell covers 102 and 103 to suction, discharge, or inject the refrigerant. The plurality of pipes 104, 105, and 106 may include a suction pipe 104 through which the refrigerant may be suctioned into the linear compressor 10, a discharge pipe 105 through which the compressed refrigerant may be discharged from the linear compressor 10, and a process pipe through which the refrigerant may be supplemented to the linear compressor 10.

For example, the suction pipe 104 may be coupled to the first shell cover 102. The refrigerant may be suctioned into the linear compressor 10 through the suction pipe 104 in an axial direction.

The discharge pipe 105 may be coupled to an outer circumferential surface of the shell 101. The refrigerant suctioned through the suction pipe 104 may flow in the axial direction and then be compressed. Also, the compressed refrigerant may be discharged through the discharge pipe 105. The discharge pipe 105 may be disposed at a position which is adjacent to the second shell cover 103 rather than the first shell cover 102.

The process pipe 106 may be coupled to the outer circumferential surface of the shell 101. A worker may inject the refrigerant into the linear compressor 10 through the process pipe 106.

The process pipe 106 may be coupled to the shell 101 at a height different from a height of the discharge pipe 105 to avoid interference with the discharge pipe 105. The height may be understood as a distance from the leg 50 in the vertical direction (or the radial direction). As the discharge pipe 105 and the process pipe 106 are coupled to the outer circumferential surface of the shell 101 at the heights different from each other, a worker's work convenience may be improved.

At least a portion of the second shell cover 103 may be disposed adjacent to an inner circumferential surface of the shell 101, which corresponds to a point to which the process pipe 106 may be coupled. That is, at least a portion of the second shell cover 103 may act as a flow resistance to the refrigerant injected through the process pipe 106.

Thus, in view of the passage of the refrigerant, the passage of the refrigerant introduced through the process pipe 106 may have a size that gradually decreases toward the inner space of the shell 101. In this process, a pressure of the refrigerant may be reduced to allow the refrigerant to be vaporized. Also, in this process, oil contained in the refrigerant may be separated. Thus, the refrigerant from which the oil is separated may be introduced into a piston 130 to improve compression performance of the refrigerant. The oil may be understood as a working oil existing in a cooling system.

A cover support part or support 102a may be disposed or provided on an inner surface of the first shell cover 102. A second support device or support 185, which will be described hereinafter, may be coupled to the cover support part 102a. The cover support part 102a and the second support device 185 may be understood as devices that support a main body of the linear compressor 10. The main body of the compressor may represent a part or portion provided in the shell 101. For example, the main body may include a drive part or drive that reciprocates forward and backward and a support part or support that supports the drive part. The drive part may include parts or components, such as the piston 130, a magnet frame 138, a permanent magnet 146, a support 137, and a suction muffler 150. Also, the support part may include parts or components, such as resonant springs 176a and 176b, a rear cover 170, a stator cover 149, a first support device or support 165, and a second support device or support 185.

A stopper 102b may be disposed or provided on the inner surface of the first shell cover 102. The stopper 102b may be understood as a component that prevents the main body of the compressor, particularly, the motor assembly 140 from being bumped by the shell 101 and thus damaged due to vibration or an impact occurring during transportation of the linear compressor 10. The stopper 102b may be disposed or provided adjacent to the rear cover 170, which will be described hereinafter. Thus, when the linear compressor 10 is shaken, the rear cover 170 may interfere with the stopper 102b to prevent the impact from being transmitted to the motor assembly 140.

A spring coupling part or portion 101a may be disposed or provided on the inner surface of the shell 101. For example, the spring coupling part 101a may be disposed at a position which is adjacent to the second shell cover 103. The spring coupling part 101a may be coupled to a first support spring 166 of the first support device 165, which will be described hereinafter. As the spring coupling part 101a and the first support device 165 are coupled to each other, the main body of the compressor may be stably supported inside of the shell 101.

Figure 3:
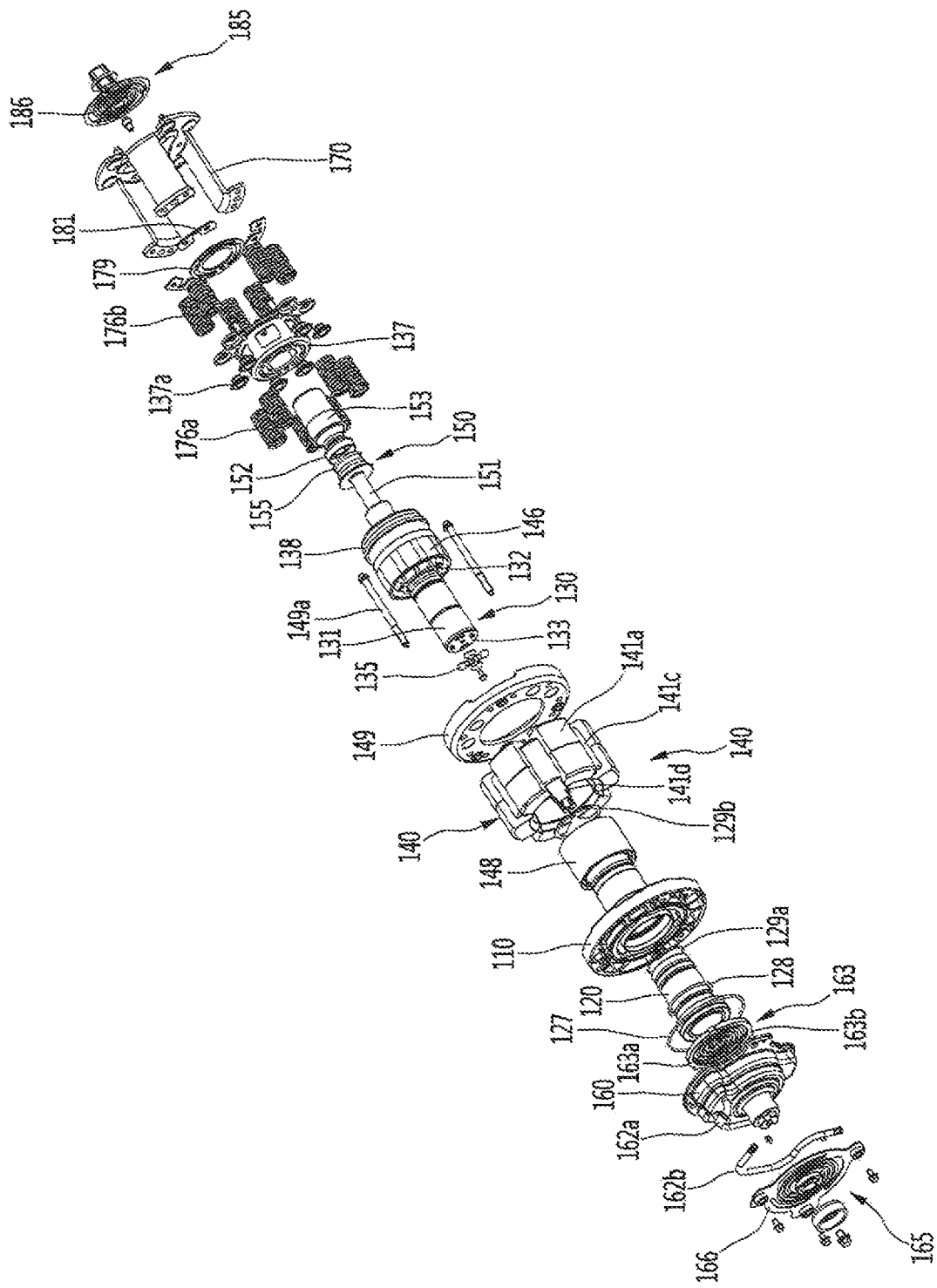
FIG. 3 is an exploded perspective view illustrating internal parts or components of the linear compressor according to an embodiment.
Figure 4:
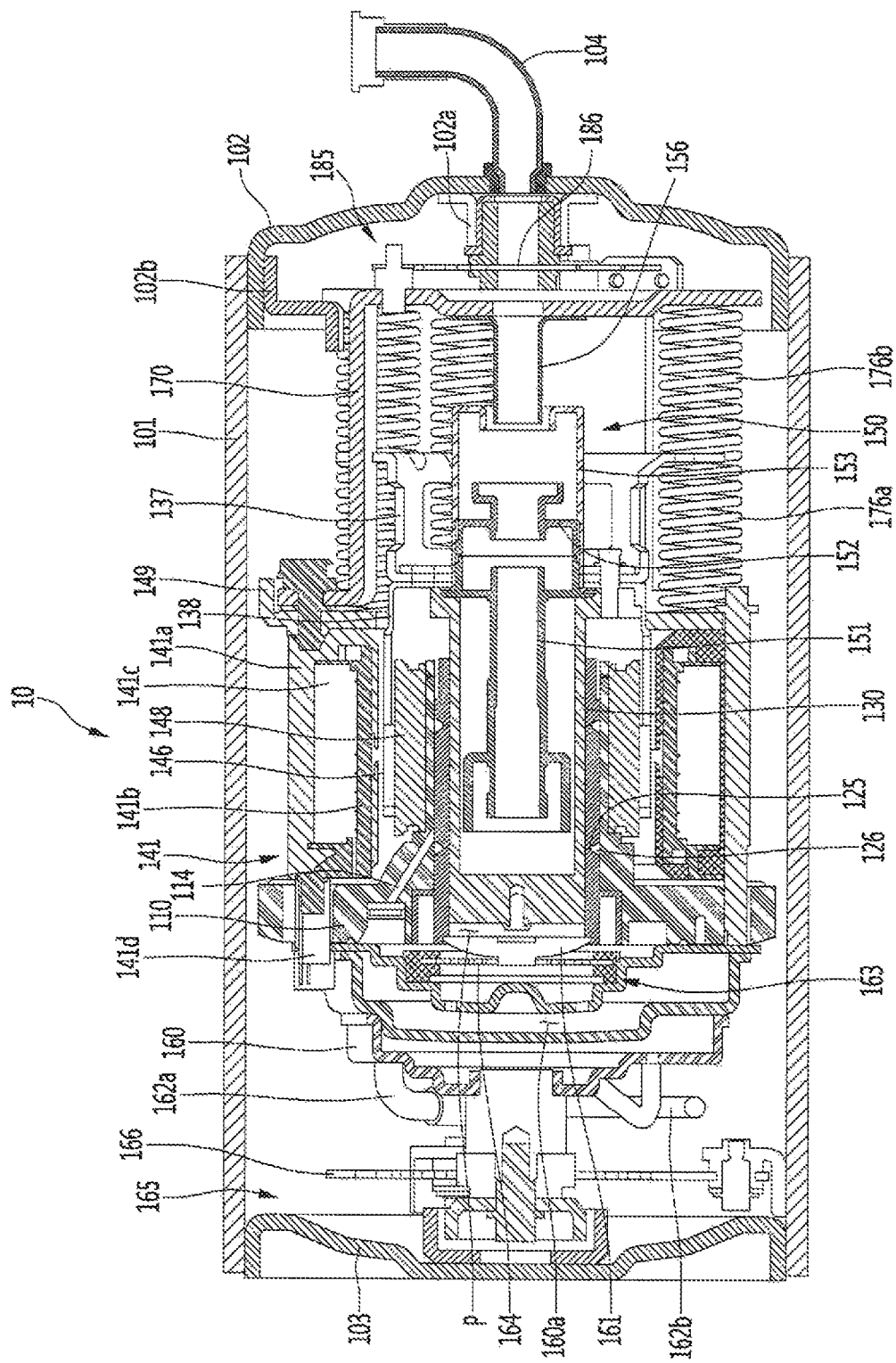
FIG. 4 is a cross-sectional view, taken along line I-I' of FIG. 1.

FIG. 3 is an exploded perspective view illustrating internal components of the linear compressor according to an embodiment. FIG. 4 is a cross-sectional view illustrating internal components of the linear compressor according to an embodiment.

Referring to FIGS. 3 and 4, the linear compressor 10 according to an embodiment may include a cylinder 120 provided in the shell 101, the piston 130, which linearly reciprocates within the cylinder 120, and the motor assembly 140, which functions as a linear motor to apply drive force to the piston 130. When the motor assembly 140 is driven, the piston 130 may linearly reciprocate in the axial direction.

The linear compressor 10 may further include a suction muffler 150 coupled to the piston 130 to reduce noise generated from the refrigerant suctioned through the suction pipe 104. The refrigerant suctioned through the suction pipe 104 may flow into the piston 130 via the suction muffler 150. For example, while the refrigerant passes through the suction muffler 150, the flow noise of the refrigerant may be reduced.

The suction muffler 150 may include a plurality of mufflers 151, 152, and 153. The plurality of mufflers 151, 152, and 153 may include a first muffler 151, a second muffler 152, and a third muffler 153, which may be coupled to each other.

The first muffler 151 may be disposed or provided within the piston 130, and the second muffler 152 may be coupled to a rear portion of the first muffler 151. Also, the third muffler 153 may accommodate the second muffler 152 therein and extend to a rear side of the first muffler 151. In view of a flow direction of the refrigerant, the refrigerant suctioned through the suction pipe 104 may successively pass through the third muffler 153, the second muffler 152, and the first muffler 151. In this process, the flow noise of the refrigerant may be reduced.

The suction muffler 150 may further include a muffler filter 155. The muffler filter 155 may be disposed or provided on or at an interface on or at which the first muffler 151 and the second muffler 152 are coupled to each other. For example, the muffler filter 155 may have a circular shape, and an outer circumferential portion of the muffler filter 155 may be supported between the first and second mufflers 151 and 152.

The "axial direction" may be understood as a direction in which the piston 130 reciprocates, that is, a horizontal direction in FIG. 4. Also, "in the axial direction", a direction from the suction pipe 104 toward a compression space P, that is, a direction in which the refrigerant flows may be defined as a "frontward direction", and a direction opposite to the frontward direction may be defined as a "rearward direction". When the piston 130 moves forward, the compression space P may be compressed. On the other hand, the "radial direction" may be understood as a direction which is perpendicular to the direction in which the piston 130 reciprocates, that is, a vertical direction in FIG. 4.

The piston 130 may include a piston body 131 having an approximately cylindrical shape and a piston flange part or flange 132 that extends from the piston body 131 in the radial direction. The piston body 131 may reciprocate inside of the cylinder 120, and the piston flange part 132 may reciprocate outside of the cylinder 120.

The cylinder 120 may be configured to accommodate at least a portion of the first muffler 151 and at least a portion of the piston body 131. The cylinder 120 may have the compression space P in which the refrigerant may be compressed by the piston 130. Also, a suction hole 133, through which the refrigerant may be introduced into the compression space P, may be defined in a front portion of the piston body 131, and a suction valve 135 that selectively opens the suction hole 133 may be disposed or provided on a front side of the suction hole 133. A coupling hole 135*a*, to which a predetermined coupling member 134 may be coupled, may be defined in an approximately central portion of the suction valve 135.

A discharge cover 160 that defines a discharge space 160*a* for the refrigerant discharged from the compression space P and a discharge valve assembly 161 and 163 coupled to the discharge cover 160 to selectively discharge the refrigerant compressed in the compression space P may be provided at a front side of the compression space P. The discharge space 160*a* may include a plurality of space parts or spaces which may be partitioned by inner walls of the discharge cover 160. The plurality of space parts may be disposed or provided in the frontward and rearward direction to communicate with each other.

The discharge valve assembly 161 and 163 may include a discharge valve 161 which may be opened when the pressure of the compression space P is above a discharge pressure to introduce the refrigerant into the discharge space and a spring assembly 163 disposed or provided between the discharge valve 161 and the discharge cover 160 to provide elastic force in the axial direction. The spring assembly 163 may include a valve spring 163*a* and a spring support part or support 163*b* that supports the valve spring 163*a* to the discharge cover 160. For example, the valve spring 163*a* may include a plate spring. Also, the spring support part 163*b* may be integrally injection-molded to the valve spring 163*a* through an injection-molding process, for example.

The discharge valve 161 may be coupled to the valve spring 163*a*, and a rear portion or rear surface of the discharge valve 161 may be disposed or provided to be supported on a front surface of the cylinder 120. When the discharge valve 161 is supported on the front surface of the cylinder 120, the compression space may be maintained in a sealed state. When the discharge valve 161 is spaced apart from the front surface of the cylinder 120, the compression space P may be opened to allow the refrigerant in the compression space P to be discharged.

The compression space P may be understood as a space defined between the suction valve 135 and the discharge valve 161. Also, the suction valve 135 may be disposed or provided on or at one or a first side of the compression space P, and the discharge valve 161 may be disposed or provided on or at the other or a second side of the compression space P, that is, an opposite side of the suction valve 135.

While the piston 130 linearly reciprocates within the cylinder 120, when the pressure of the compression space P is below the discharge pressure and a suction pressure, the suction valve 135 may be opened to suction the refrigerant into the compression space P. On the other hand, when the pressure of the compression space P is above the suction pressure, the suction valve 135 may compress the refrigerant of the compression space P in a state in which the suction valve 135 is closed.

When the pressure of the compression space P is above the discharge pressure, the valve spring 163*a* may be deformed forward to open the discharge valve 161. The refrigerant may be discharged from the compression space P into the discharge space of the discharge cover 160. When the discharge of the refrigerant is completed, the valve spring 163*a* may provide a restoring force to the discharge valve 161 to close the discharge valve 161.

The linear compressor 10 may further include a cover pipe 162*a* coupled to the discharge cover 160 to discharge the refrigerant flowing through the discharge space of the discharge cover 160. For example, the cover pipe 162*a* may be made of a metal material.

Also, the linear compressor 10 may further include a loop pipe 162*b* coupled to the cover pipe 162*a* to transfer the refrigerant flowing through the cover pipe 162*a* to the discharge pipe 105. The loop pipe 162*b* may have one or a first side or end coupled to the cover pipe 162*a* and the other or a second side or end coupled to the discharge pipe 105.

The loop pipe 162*b* may be made of a flexible material and have a relatively long length. Also, the loop pipe 162*b* may roundly extend from the cover pipe 162*a* along the inner circumferential surface of the shell 101 and be coupled to the discharge pipe 105. For example, the loop pipe 162*b* may have a wound shape.

The linear compressor 10 may further include a frame 110. The frame 110 is understood as a component for fixing the cylinder 120. For example, the cylinder 120 may be press-fitted into the frame 110. Each of the cylinder 120 and the frame 110 may be made of aluminum or an aluminum alloy material, for example.

The frame 110 may be disposed or provided to surround the cylinder 120. That is, the cylinder 120 may be disposed or provided to be accommodated into the frame 110. Also, the discharge cover 160 may be coupled to a front surface of the frame 110 using a coupling member.

The motor assembly 140 may include an outer stator 141 fixed to the frame 110 and disposed or provided to surround the cylinder 120, an inner stator 148 disposed or provided to be spaced inward from the outer stator 141, and the permanent magnet 146 disposed or provided in a space between the outer stator 141 and the inner stator 148.

The permanent magnet 146 may be linearly reciprocated by mutual electromagnetic force between the outer stator 141 and the inner stator 148. Also, the permanent magnet 146 may be provided as a single magnet having one polarity or by coupling a plurality of magnets having three polarities to each other.

A magnet frame 138 may be installed or provided on the permanent magnet 146. The magnet frame 138 may have an approximately cylindrical shape and be disposed or provided to be inserted into the space between the outer stator 141 and the inner stator 148.

Referring to the cross-sectional view of FIG. 4, the magnet frame 138 may be coupled to the piston flange part 132 to extend in an outer radial direction and then be bent forward. The permanent magnet 146 may be installed or provided on a front portion of the magnet frame 138. When the permanent magnet 146 reciprocates, the piston 130 may reciprocate together with the permanent magnet 146 in the axial direction.

The outer stator 141 may include coil winding bodies 141*b*, 141*c*, and 141*d* and a stator core 141*a*. The coil winding bodies 141*b*, 141*c*, and 141*d* may include a bobbin 141*b* and a coil 141*c* wound in a circumferential direction of the bobbin 141*b*. The coil winding bodies 141*b*, 141*c*, and 141*d* may further include a terminal part or portion 141*d* that guides a power line connected to the coil 141*c* so that the power line is led out or exposed to the outside of the outer stator 141. The terminal part 141*d* may be inserted into a terminal insertion part or portion of the frame 110.

The stator core 141*a* may include a plurality of core blocks in which a plurality of laminations are laminated in a circumferential direction. The plurality of core blocks may be disposed or provided to surround at least a portion of the coil winding bodies 141b and 141c.

A stator cover 149 may be disposed or provided on one or a first side of the outer stator 141. That is, the outer stator 141 may have one or a first side supported by the frame 110 and the other or a second side supported by the stator cover 149.

The linear compressor 10 may further include a cover coupling member 149a that couples the stator cover 149 to the frame 110. The cover coupling member 149a may pass through the stator cover 149 to extend forward to the frame 110 and then be coupled to a first coupling hole of the frame 110.

The inner stator 148 may be fixed to a circumference of the frame 110. Also, in the inner stator 148, the plurality of laminations may be laminated in the circumferential direction outside of the frame 110.

The linear compressor 10 may further include a support 137 that supports the piston 130. The support 137 may be coupled to a rear portion of the piston 130, and the muffler 150 may be disposed or provided to pass through the inside of the support 137. The piston flange part 132, the magnet frame 138, and the support 137 may be coupled to each other using a coupling member.

A balance weight 179 may be coupled to the support 137. A weight of the balance weight 179 may be determined based on a drive frequency range of the compressor body.

The linear compressor 10 may further include a rear cover 170 coupled to the stator cover 149 to extend backward and supported by the second support device 185. The rear cover 170 may include three support legs, and the three support legs may be coupled to a rear surface of the stator cover 149. A spacer 181 may be disposed or provided between the three support legs and the rear surface of the stator cover 149. A distance from the stator cover 149 to a rear end of the rear cover 170 may be determined by adjusting a thickness of the spacer 181. Also, the rear cover 170 may be spring-supported by the support 137.

The linear compressor 10 may further include an inflow guide part or guide 156 coupled to the rear cover 170 to guide an inflow of the refrigerant into the muffler 150. At least a portion of the inflow guide part 156 may be inserted into the suction muffler 150.

The linear compressor 10 may further include a plurality of resonant springs 176a and 176b which may be adjusted in natural frequency to allow the piston 130 to perform a resonant motion. The plurality of resonant springs 176a and 176b may include a first resonant spring 176a supported between the support 137 and the stator cover 149 and a second resonant spring 176b supported between the support 137 and the rear cover 170. The drive part that reciprocates within the linear compressor 10 may be stably moved by the action of the plurality of resonant springs 176a and 176b to reduce vibration or noise due to movement of the drive part. The support 137 may include a first spring support part or support 137a coupled to the first resonant spring 176a.

The linear compressor 10 may include the frame 10 and a plurality of sealing members or seals 127, 128, 129a, and 129b that increases a coupling force between the frame 110 and peripheral parts or components around the frame 110. The plurality of sealing members 127, 128, 129a, and 129b may include a first sealing member or seal 127 disposed or provided at a portion at which the frame 110 and the discharge cover 160 are coupled to each other. The first sealing member 127 may be disposed or provided on or in a second installation groove of the frame 110.

The plurality of sealing members 127, 128, 129a, and 129b may further include a second sealing member or seal 128 disposed or provided at a portion at which the frame 110 and the cylinder 120 are coupled to each other. The second sealing member 128 may be disposed or provided on or in a first installation groove (not shown) of the frame 110.

The plurality of sealing members 127, 128, 129a, and 129b may further include a third sealing member or seal 129a disposed or provided between the cylinder 120 and the frame 110. The third sealing member 129a may be disposed or provided on or in a cylinder groove defined in the rear portion of the cylinder 120. The third sealing member 129a may prevent external leakage of a refrigerant of a gas pocket defined between an inner circumferential surface of the frame 110 and an outer circumferential surface of the cylinder 120 and function to increase a coupling force between the frame 110 and the cylinder 120.

The plurality of sealing members 127, 128, 129a, and 129b may further include a fourth sealing member or seal 129b disposed or provided at a portion at which the frame 110 and the inner stator 148 are coupled to each other. The fourth sealing member 129b may be disposed or provided on or in a third installation groove of the frame 110. Each of the first to fourth sealing members 127, 128, 129a, and 129b may have a ring shape.

The linear compressor 10 may further include a first support device or support 165 coupled to support one or a first side of the main body of the linear compressor 10. The first support device 165 may be disposed or provided adjacent to the second shell cover 103 to elastically support the main body of the linear compressor 10. The first support device 165 may include a first support spring 166. The first support spring 166 may be coupled to the spring coupling part 101a.

The linear compressor 10 may further include a second support device or support 185 coupled to the rear cover 170 to support the other or a second side of the main body of the linear compressor 10. The second support device 185 may be coupled to the first shell cover 102 to elastically support the main body of the linear compressor 10. The second support device 185 may include a second support spring 186. The second support spring 186 may be coupled to the cover support part 102a.

Figure 5:
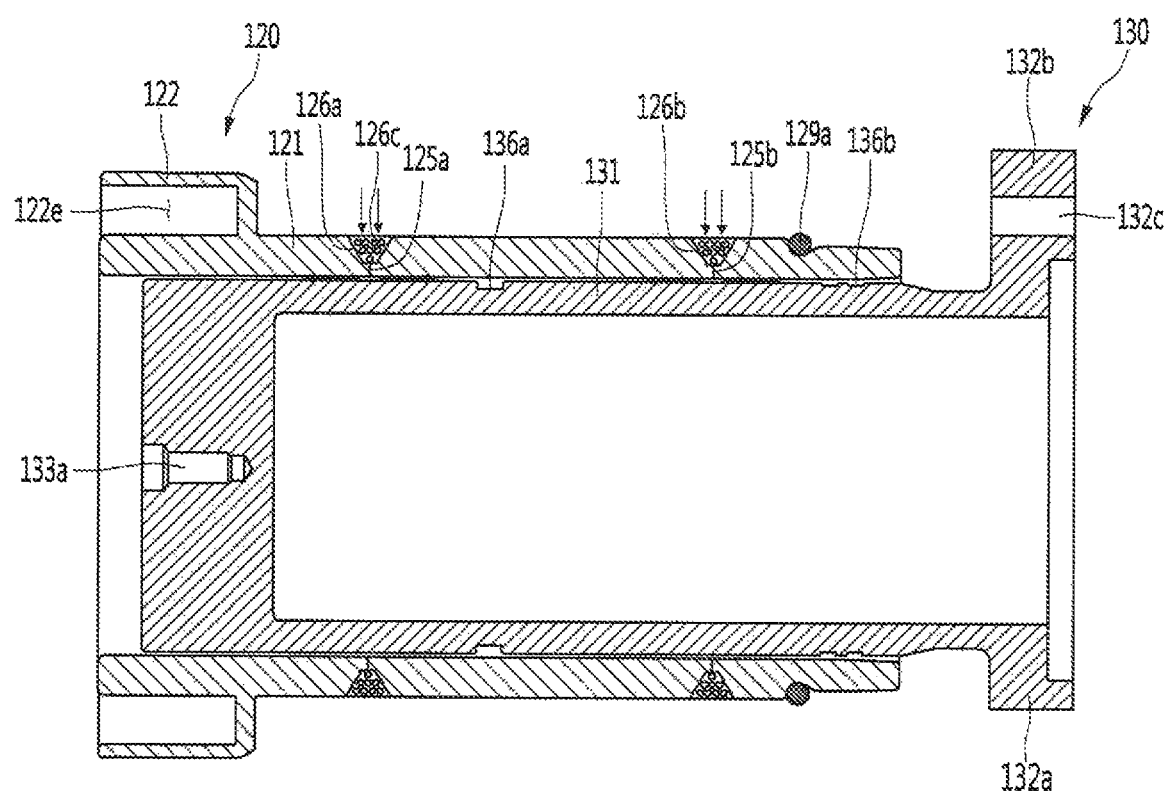
FIG. 5 is a cross-sectional view illustrating a state in which a piston is inserted into a cylinder according to an embodiment.

FIG. 5 is a cross-sectional view illustrating a state in which a piston is inserted into a cylinder according to an embodiment. Referring to FIG. 5, the cylinder 120 according to an embodiment may include a cylinder body 121 that extends in an axial direction and a cylinder flange 122 disposed or provided outside of or at a front portion of the cylinder body 121. The cylinder body 121 may have a cylindrical shape with a central axis or central axis in the axial direction and be inserted into the frame 110. Thus, an outer circumferential surface of the cylinder body 121 may be disposed to face an inner circumferential surface of the frame 110.

The cylinder body 121 may define a gas inflow part or inflow 126 through which at least a portion of a refrigerant discharged through the discharge valve 161 may be introduced. At least a portion of the refrigerant may be understood as a refrigerant used as a gas bearing between the piston 130 and the cylinder 120.

The refrigerant used as the gas bearing may pass through a gas hole 114 defined in the frame 110 and flow into the gas pocket formed between the inner circumferential surface of the frame 110 and the outer circumferential surface of the cylinder 120. The refrigerant of the gas pocket may flow into the gas inflow part 126.

The gas inflow part 126 may be recessed inward from the outer circumferential surface of the cylinder body 121 in the radial direction. Also, the gas inflow part 126 may have a circular shape along the outer circumferential surface of the cylinder body 121 with respect to the central axis in the axial direction.

A plurality of the gas inflow part 126 may be provided. For example, two gas inflow parts 126 may be provided. A first gas inflow part or inflow 126a of the two gas inflow parts 126 may be disposed or provided on or at the front portion of the cylinder body 121, that is, at a position which is close to the discharge valve 161, and a second gas inflow part or inflow 126b may be disposed or provided on or at a rear portion of the cylinder body 121, that is, at a position which is close to a compressor suction side of the refrigerant. That is, the first gas inflow part 126a may be disposed or provided at a front side with respect to a central portion in a frontward and rearward direction of the cylinder body 121, and the second gas inflow part 126b may be disposed or provided at a rear side.

A cylinder filter member or filter 126c may be installed or provided on or in the first and second gas inflow parts 126a and 126b. The cylinder filter member 126c may prevent a foreign substance having a predetermined size or more from being introduced into the cylinder 120 and perform a function of adsorbing oil contained in the refrigerant. The predetermined size may be about 1 μm.

A cylinder filter member 126c may include a thread which is wound around the gas inflow part 126. The thread may be made of a polyethylene terephthalate (PET) material and have a predetermined thickness or diameter.

The cylinder body 121 may further include a cylinder nozzle 125 that extends inward from the gas inflow part 126 in the radial direction. The cylinder nozzle 125 may extend up to the inner circumferential surface of the cylinder body 121. The cylinder nozzle 125 may include a first nozzle part or nozzle 125a that extends from the first gas inflow part 126a to the inner circumferential surface of the cylinder body 121 and a second nozzle part or nozzle 125b that extends from the second gas inflow part 126b to the inner circumferential surface of the cylinder body 121.

The refrigerant which is filtered by the cylinder filter member 126c while passing through the first gas inflow part 126a may be introduced into a space between the inner circumferential surface of the first cylinder body 121 and the outer circumferential surface of the piston body 131 through the first nozzle part 125a. The refrigerant which is filtered by the cylinder filter member 126c while passing through the second gas inflow part 126b may be introduced into a space between the inner circumferential surface of the first cylinder body 121 and the outer circumferential surface of the piston body 131 through the second nozzle part 125b. The gas refrigerant flowing to the outer circumferential surface of the piston body 131 through the first and second nozzle parts 125a and 125b may provide a lifting force to the piston 130 to perform a function as a gas bearing with respect to the piston 130.

The cylinder flange 122 may include a first flange that extends outward from the cylinder body 121 in the radial direction and a second flange that extends forward from the first flange. Also, the cylinder body 121 and the cylinder flange 122 may define a deformable space part or space 122e which is deformable when the cylinder 120 is press-fitted into the frame 110.

Figure 6:
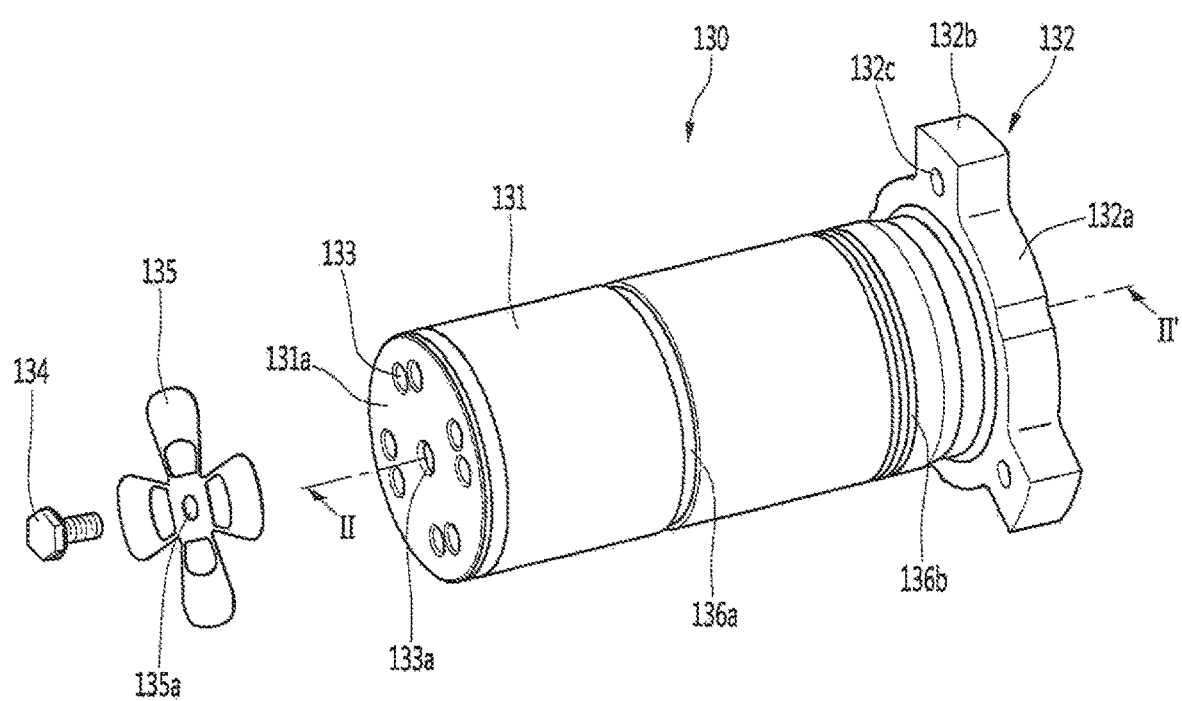
FIG. 6 is an exploded perspective view illustrating a piston and a suction valve according to an embodiment.
Figure 7:
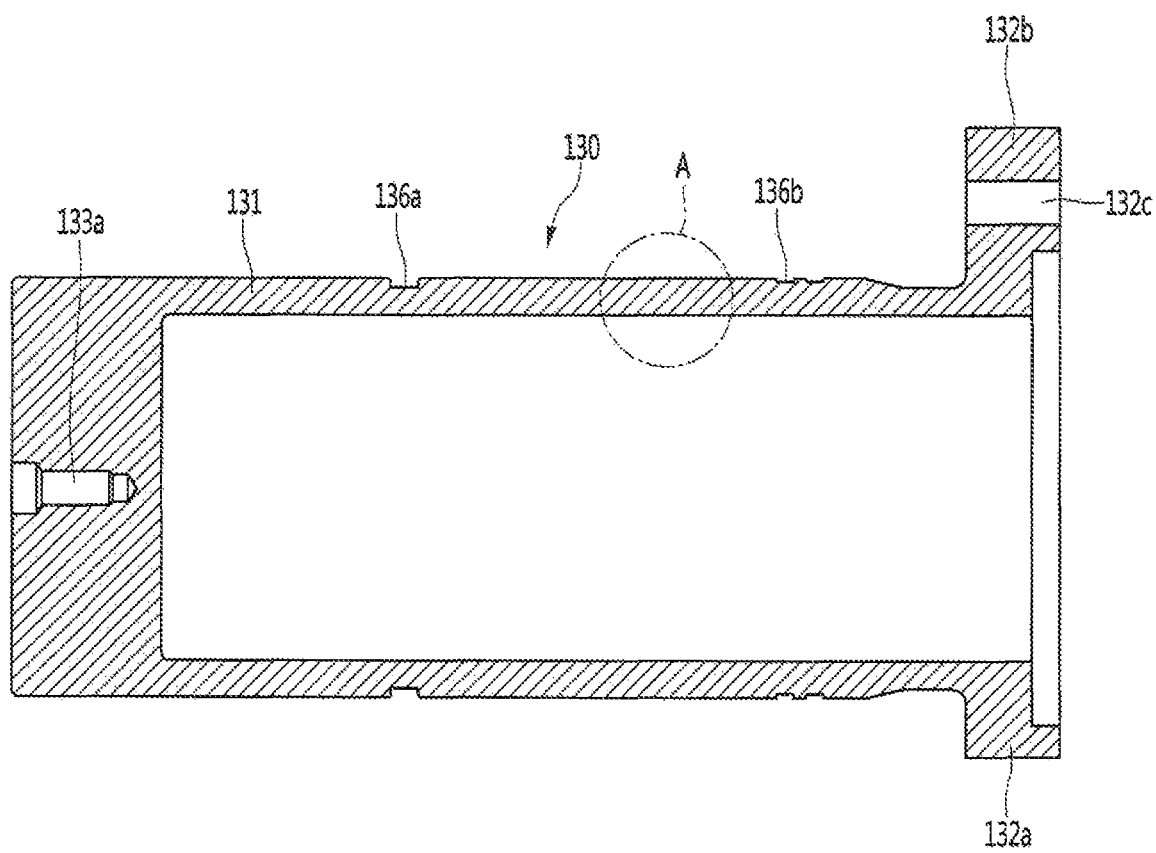
FIG. 7 is a cross-sectional view, taken along line 1-II' of FIG. 6.
Figure 8:
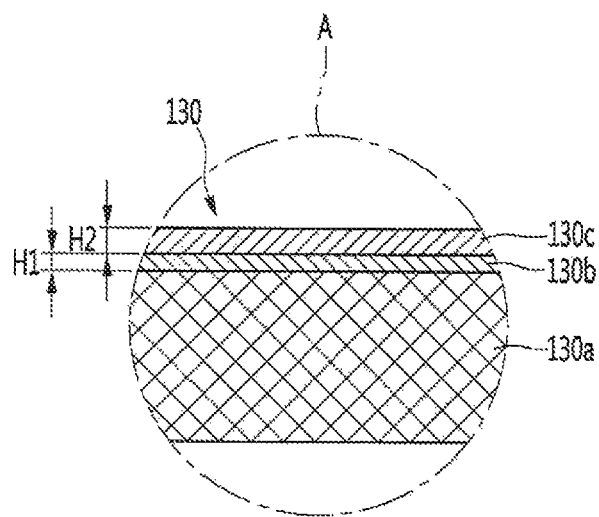
FIG. 8 is an enlarged view illustrating a portion A of FIG. 7.

FIG. 6 is an exploded perspective view illustrating a piston and a suction valve according to an embodiment. FIG. 7 is a cross-sectional view taken along line II-II' of FIG. 6. FIG. 8 is an enlarged view illustrating a portion A of FIG. 7.

Referring to FIGS. 6 to 8, linear compressor 10 according to an embodiment may include piston 130 that reciprocates within the cylinder 120 in the axial direction, that is, the frontward and rearward direction, and suction valve 135 coupled to a front side of the piston 130.

The linear compressor 10 may further include a valve coupling member 134 that couples the suction valve 135 to a coupling hole 133a of the piston 130. The coupling hole 133a may be defined in an approximately central portion of a front end surface of the piston 130. The valve coupling member 134 may pass through a valve coupling hole 135a of the suction valve 135 and be coupled to the coupling hole 133a.

The piston 130 may include a piston body 131 having an approximately cylindrical shape and extending in the frontward and rearward direction and piston flange 132 that extends outward from the piston body 131 in the radial direction. The front portion of the piston body 131 may include a main body front end 131a in which the coupling hole 133a may be defined. A suction hole 133 which may be selectively covered by the suction valve 135 may be defined in the main body front end 131a. A plurality of the suction hole 133 may be provided, and the plurality of suction holes 133 may be defined outside of the coupling hole 133a. For example, the plurality of suction holes 133 may be defined to surround the coupling hole 133a.

A rear portion of the piston body 131 may be opened to suction the refrigerant. At least a portion of the suction muffler 150, that is, the first muffler 151 may be inserted into the piston body 131 through the opened rear portion of the piston body 131.

A first piston groove 136a may be defined on the outer circumferential surface of the piston body 131. The first piston groove 136a may be defined on a front side with respect to a central line in the radial direction of the piston body 131. The first piston groove 136a may be understood as a component that guides smooth flow of the refrigerant gas introduced through the cylinder nozzle 125 and prevents a pressure loss from occurring. Also, the first piston groove 136a may be formed along the outer circumferential surface of the piston body 131, and thus, may have, for example, a ring shape.

A second piston groove 136b may be defined on the outer circumferential surface of the piston body 131. The second piston groove 136b may be defined on a rear side with respect to a central line in the radial direction of the piston body 131. The second piston groove 136b may be understood as a "discharge guide groove" that guides the discharge of the refrigerant gas used for lifting the piston 130 to the outside of the cylinder 120. As the refrigerant gas is discharged to the outside of the cylinder 120 through the second piston groove 136b, the refrigerant gas used as the gas bearing may be prevented from being introduced again into the compression space P via the front side of the piston body 131.

The second piston groove 136b may be spaced apart from the first piston groove 136a and formed along the outer circumferential surface of the piston body 131. For example, the second piston groove 136b may have a ring shape. A plurality of the second piston groove 136b may be provided. A size of the second piston groove 136b may be smaller than a size of the first piston groove 136a.

The piston flange 132 may include a flange body 132a that extends outward from the rear side of the piston body 131 in the radial direction, and a piston coupling part or portion 132*b* that further extends outward from the flange body 132*a* in the radial direction. The piston coupling part 132*b* may include a piston coupling hole 132*c* to which a predetermined coupling member may be coupled. The coupling member may pass through the piston coupling hole 132*c* and be coupled to the magnet frame 138 and the support 137. A plurality of the piston coupling part 132*b* may be provided, and the plurality of piston coupling parts 132*b* may be spaced apart from each other and disposed on an outer circumferential surface of the flange body 132*a*. The second piston groove 136*b* may be understood as being disposed or provided between the first piston groove 136*a* and the piston flange 132.

The piston 130 may be made of aluminum or an aluminum alloy. Surface treatment may be performed on the piston 130 to thereby improve abrasion resistance of the piston 130. For example, the surface treatment of the piston 130 may be performed on the piston body 131 and the piston flange 132.

The piston 130 may include a surface treatment body 130*a*, a first surface treatment part or treatment 130*b* provided on an outer surface of the surface treatment body 130*a*, and a second surface treatment part or treatment 130*c* provided on an outer surface of the first surface treatment part 130*b*.

The surface treatment body 130*a* may be understood as a mother body in a state in which manufacturing of the piston body 131 and the piston flange 132 is completed and cleaning thereof is completed, prior to the surface treatment. That is, the surface treatment body 130*a* may include the piston body 131 and the piston flange 132. For example, a thickness of the surface treatment body 130*a*, in particular, the piston body 131, may be in a range of about 2.5 mm to about 3 mm.

The first surface treatment part 130*b* may include chromium nitride (CrN). Chromium nitride may be formed on the outer surface of the surface treatment body 130*a* by vacuum deposition processes. For example, the first surface treatment part 130*b* may be formed by a physical vapor deposition (PVD) process among vacuum deposition processes. The PVD process may include a sputtering process.

The chromium nitride may be provided between the surface treatment body 130*a* and the second surface treatment part 130*c* and function to improve an adhesion force between the surface treatment body 130*a* and the second surface treatment part 130*c* and absorb stress.

A thickness H1 of the first surface treatment part 130*b* may be in a range of about 1.4 µm to about 2.4 µm. For example, the thickness of the first surface treatment part 130*b* may be about 1.9 µm. A surface hardness of the first surface treatment part 130*b* may be about 500 Hv or more. "Hv" means or refers to Vicker's hardness.

As the piston 130 is made of aluminum or an aluminum alloy having a relatively low hardness, the first surface treatment part 130*b* may prevent a phenomenon in that stress of the second surface treatment part 130*b* having a high hardness acts on the piston 130, causing a deformation or abrasion of the piston 130.

The second surface treatment part 130*c* may include diamond-like carbon (DLC). The DLC may be formed on the outer surface of the surface treatment body 130*a* by vacuum deposition processes. For example, the second surface treatment part 130*c* may be formed by a chemical vapor deposition (CVD) process among vacuum deposition processes. The CVD process may include a plasma enhanced chemical vapor deposition (PECVD) process.

The second surface treatment part 130*c* may be disposed to face the inner circumferential surface of the cylinder 120 and have excellent self-lubrication characteristics and low friction coefficient characteristics, thereby improving abrasion resistance. Therefore, the piston 130 may reduce abrasion in a friction action of the cylinder 120. The second surface treatment part 130*c* may be chemically stable, have excellent surface roughness, and may improve performance of the gas bearing.

A thickness $H_2$ of the second surface treatment part 130*c* may be in a range of about 2.1 µm to about 3.7 µm. For example, the thickness of the second surface treatment part 130*c* may be about 2.9 µm. A surface hardness of the second surface treatment part 130*c* may be about 1,400 Hv or more.

The thickness of the second surface treatment part 130*c* may be greater than the thickness of the first surface treatment part 130*b*. In practice, in terms of the function of the surface treatment part, the surface treatment part contributing to the abrasion resistance of the piston 130 is the second surface treatment part 130*c*, and the first surface treatment part 130*b* brings the surface treatment body 130*a* into close contact with the second surface treatment part 130*c* and absorbs stress transferred from the second surface treatment part 130*c* to thereby reduce the action of the stress on the surface treatment body 130*a*. Therefore, when the thickness of the second surface treatment part 130*c* is relatively large and the thickness of the first surface treatment part 130*b* is sufficiently large to absorb the stress, the abrasion resistance of the piston 130 may be increased and a time and cost of the operation process may be reduced.

That is, when the thickness of the first surface treatment part 130*b* or the second surface treatment part 130*c* increases, the surface treatment performance may be improved, but much time and cost is involved. As the thickness of the surface treatment part affects a bearing tolerance design between the inner circumferential surface of the cylinder and the outer circumferential surface of the piston, the increase in the thickness above a preset or predetermined level may be limited.

A cylinder surface treatment part or treatment may be provided on the inner circumferential surface of the cylinder body 121. The cylinder surface treatment part may be disposed to face the second surface treatment part 130*c* of the piston 130. As the cylinder 120 is a stationary device and the piston 130 is a high-speed reciprocating device, the piston 130 may be formed to have a surface hardness greater than a surface hardness of the cylinder 120 so as to reduce the abrasion of the piston 130.

Therefore, the second surface treatment part 130*c* may be formed to have a surface hardness greater than a surface hardness of the cylinder surface treatment part provided on the inner circumferential surface of the cylinder body 121. The cylinder body 121 may be made of aluminum or an aluminum alloy.

For example, the cylinder surface treatment part 129 may include an anodizing layer. A surface hardness of the anodizing layer may change according to a state or a component of a material to be coated. However, the surface hardness of the anodizing layer may be in a range of about 500 Hv to about 600 Hv.

A technology for forming the anodizing layer may be a type of aluminum painting, for example. This technology may be understood as a processing technology using characteristics that an aluminum surface is oxidized by oxygen generated at an anode when aluminum is used as the anode and an electric current flows therethrough, and consequently, an alumina layer is formed. The anodizing layer has excellent corrosion resistance and insulation resistance characteristics.

Figure 9:
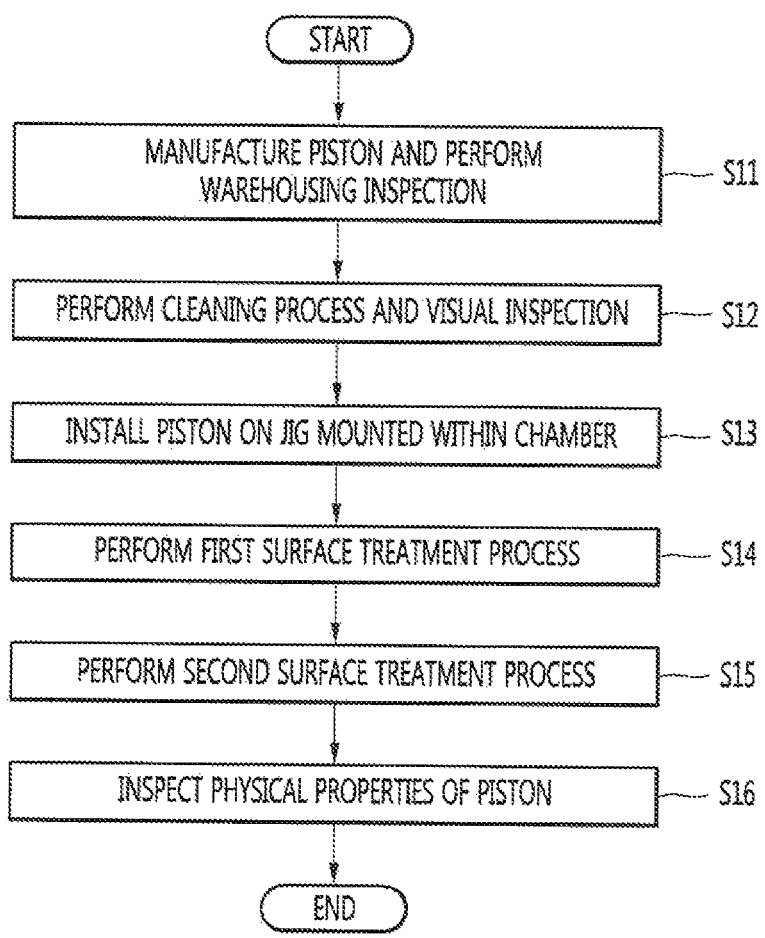
FIG. 9 is a flowchart of a method for manufacturing a linear compressor according to an embodiment.
Figure 10:
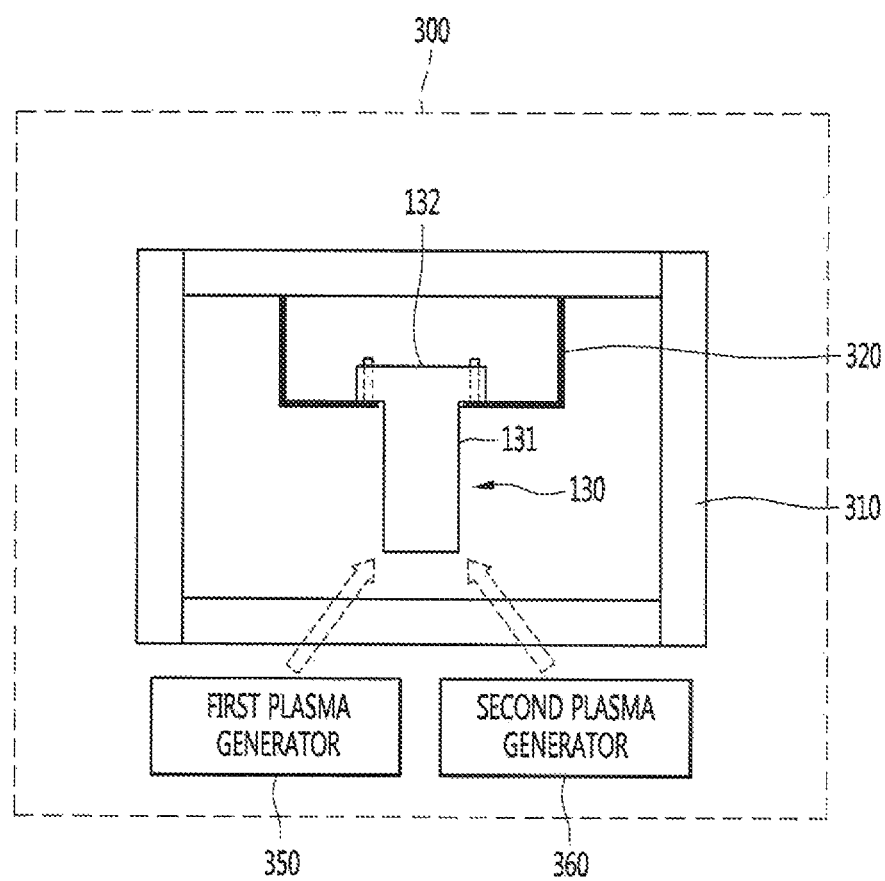
FIG. 10 is a view illustrating an apparatus for manufacturing a linear compressor according to an embodiment.
Figure 11:
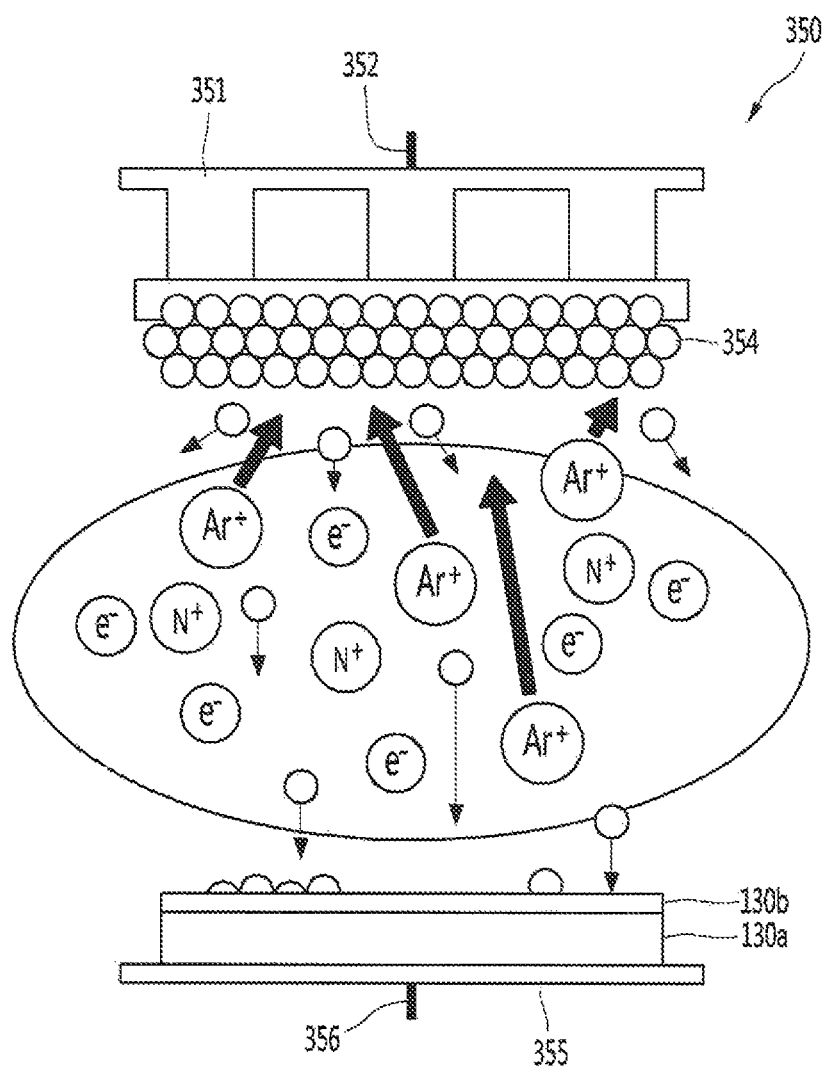
FIG. 11 is a view illustrating a process of forming a first surface treatment part or treatment on a piston according to an embodiment.
Figure 12:
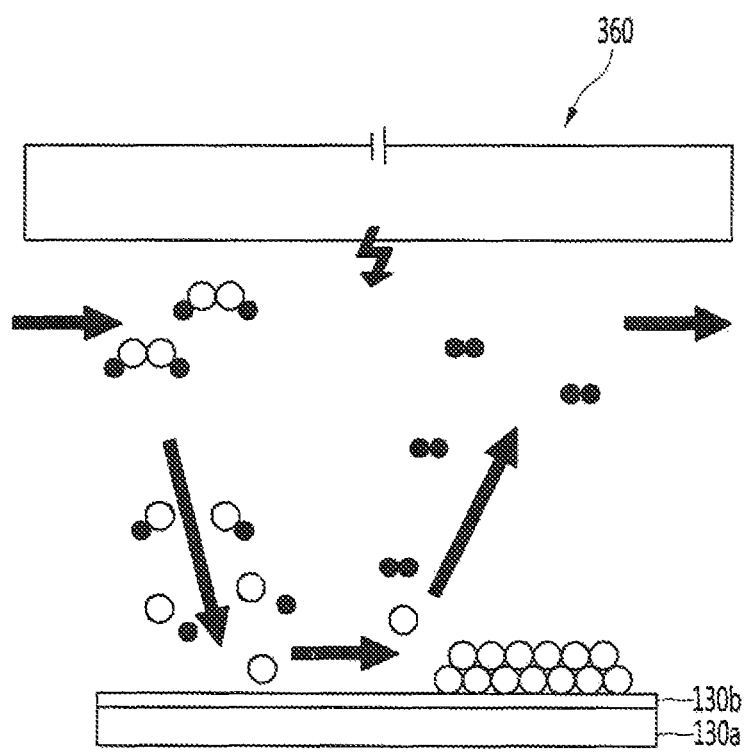
FIG. 12 is a view illustrating a process of forming a second surface treatment part or treatment on the piston according to an embodiment.

FIG. 9 is a flowchart of a method for manufacturing a linear compressor according to an embodiment. FIG. 10 is a view illustrating an apparatus for manufacturing a linear compressor according to an embodiment FIG. 11 is a view illustrating a process of forming a first surface treatment part or treatment on a piston according to an embodiment. FIG. 12 is a view illustrating a process of forming a second surface treatment part or treatment on the piston according to an embodiment.

The method for manufacturing the linear compressor 10 according to an embodiment will be described with reference to FIGS. 9 to 12. When the manufacturing of the piston 130, that is, the piston body 131 and the piston flange 132, is completed, warehousing for surface treatment may be performed, and a worker may perform warehousing inspection so as to check whether there is a defect in the piston 130 (S11).

After the warehousing inspection, a cleaning process may be performed on the piston 130. For example, the piston 130 may be ultrasonically cleaned. After the cleaning process, a visual inspection may be performed (S12).

The piston 130, whose visual inspection has been completed, may be installed on a jig (see reference numeral 310 of FIG. 10) mounted within a chamber (see reference numeral 300 of FIG. 10). The jig 310 may include a piston support device or support 320, and the piston flange 132 of the piston 130 may be stably coupled to the piston support device 320. For example, the piston body 131 may be disposed to extend downward from the piston support device 320 or the piston flange 132 (S13).

A surface treatment process of the piston 130 is performed. The surface treatment process may include a coating process using vacuum deposition.

A first surface treatment process of the piston 130 may be performed. A gas remaining in the chamber 300 may be removed to form a vacuum state of a certain level. The chamber 300 may include argon gas (Ar) and free electrons (e−) as a carrier gas. The chamber 300 may further include nitrogen gas ($N_2$). For example, the nitrogen gas may be injected.

Referring to FIGS. 10 and 11, a first plasma generator 350 may be installed in the chamber 300. The first surface treatment process of the piston 130 may be performed using the first plasma generator 350. The first surface treatment process may include a PVD process.

The first plasma generator 350 may include a first substrate 351 having a first voltage supply part or supply 352 to which a negative (−) voltage may be applied, and target particles 354 forming a target to be surface-treated on the piston 130. The target particles 354 may include chromium (Cr).

The first plasma generator 350 may include a second substrate 355 having a second voltage supply part or supply 356 to which a positive (+) voltage may be applied, and a surface treatment body 130a which may be provided in the second substrate 355 and on which a surface treatment process may be performed. That is, the positive (+) voltage may be applied to the surface treatment body 130a through the second substrate 355.

When the negative (−) voltage and the positive (+) voltage are respectively applied to the first substrate 351 and the second substrate 355, free electrons (e−) having negative (−) characteristics collide with the argon gas and the nitrogen gas while moving toward the positive (+) electrode, that is, the second substrate 355. In this process, plasma may be generated.

Due to the collision, the argon gas and the nitrogen gas are ionized into argon ions (Ar+) and nitrogen ions (N+). The argon ions (Ar+) and the nitrogen ions (N+) move toward the target particles 354 to which the negative (−) voltage is applied.

The argon ions (Ar+) and the nitrogen ions (N+) collide with the target particles 354 and separate the target particles 354 from the first substrate 351. The separated target particles 354 may be bonded to the nitrogen ions (N+), and the bonded particles (CrN) may be deposited on the surface treatment body 130a. This is a "first vacuum deposition process" and is referred to as sputtering. Due to the sputtering, a first surface treatment part 130b may be formed in or on the piston 130 (S14).

After the first surface treatment part 130b is formed, a process for forming a second surface treatment part 130c may be performed in the chamber 300. A second plasma generator 360 may be installed in the chamber 300. A second surface treatment process of the piston 130 may be performed using the second plasma generator 360. The second surface treatment process may include a CVD process.

Acetylene ($C_2H_2$) gas serving as working gas may be injected into the chamber 300. A high voltage may be applied through an electrode of the second plasma generator 360. Due to the applied voltage, the acetylene gas may be ionized and converted to a plasma state.

A chemical reaction may be induced by applying high-temperature heat to the ionized particles. During the chemical reaction of the ionized particles, carbon (C) is deposited on the surface of the first surface treatment part 130b, and the other ions (H+) bonded to each other and discharged in a gaseous state ($H_2$). This is a "second vacuum deposition process" and is referred to as a PECVD process. Due to the PECVD process, the second surface treatment part 130c may be formed on the outer surface of the first surface treatment part 130b (S15).

According to the manufacturing method, the first surface treatment part 130b and the second surface treatment part 130b may be sequentially deposited on the outer surface of the piston 130. The structure of the first surface treatment part 130b may improve abrasion resistance of the piston 130. Also, the structure of the second surface treatment part 130c may increase a coupling force between the piston 130 and the second surface treatment part 130c and reduce stress transferred to the piston 130.

As the first and second surface treatment parts 130b and 130c may be sequentially performed within one chamber 300, the surface treatment process of the piston 130 may be simplified and costs thereof reduced.

After the second surface treatment process, physical properties of the surface-treated piston 130, that is, a hardness, roughness, and thickness of the piston 130, may be inspected (S16).

Another embodiment is proposed.

The first surface treatment part 130b may include a plurality of surface treatment parts or treatments. The plurality of surface treatment parts may include one surface treatment part or treatment made of chromium nitride (CrN) described above and another surface treatment part or treatment made of a nickel-phosphorus (Ni—P) ally.

The nickel-phosphorus alloy may be formed on the outer surface of the piston body 131 by an electroless nickel plating process, and may have a chemical composition ratio of 90% to 92% of Ni and 9% to 10% of P. The nickel-phosphorus alloy improves corrosion resistance and abrasion resistance of the surface and has excellent lubrication characteristics. The surface hardness of the nickel-phosphorus alloy may be in a range of about 600 Hv to about 700 Hv.

For example, one surface treatment part made of the chromium nitride may be provided on the outer surface of the surface treatment part 103a, and another surface treatment part made of the nickel-phosphorus alloy may be provided on the outer surface of the one surface treatment part. The second surface treatment part 130c may be provided on the outer surface of the another surface treatment part.

For another example, another surface treatment part made of the nickel-phosphorus alloy may be provided on the outer surface of the surface treatment part 103a, and one surface treatment part made of the chromium nitride may be provided on the outer surface of the another surface treatment part. The second surface treatment part 130c may be provided on the outer surface of the one surface treatment part.

According to embodiments disclosed herein, the compressor including internal parts or components may be decreased in size to reduce a volume of a machine room of a refrigerator, and thus, an inner storage space of the refrigerator may increase. Also, a drive frequency of the compressor may increase to prevent internal parts or components from being deteriorated in performance due to the decreased size thereof. In addition, the gas bearing may be applied between the cylinder and the piston to reduce a friction force generated by oil.

Also, as the surface treatment part may be formed on the outer circumferential surface of the piston, it is possible to prevent an occurrence of abrasion on surface of the piston during a reciprocating motion of the piston. In particular, abrasion resistance of the piston may be increased by forming two surface treatment parts on the outer circumferential surface of the piston. The two surface treatment parts may include a first surface treatment part or treatment surface-treated by chromium nitride (CrN) and a second surface treatment part or treatment surface-treated by diamond-like carbon (DLC), thereby increasing abrasion resistance of the piston.

The first surface treatment part may be provided between the surface treatment body of the piston and the second surface treatment part and function to improve an adhesion force between the surface treatment body and the second surface treatment part and absorb stress. In particular, as the piston may be made of aluminum or an aluminum alloy having a relatively low hardness, the first surface treatment part may prevent a phenomenon in that a stress of the second surface treatment part having a high hardness acts on the piston, causing a deformation or abrasion of the piston.

In particular, as the piston may be made of aluminum or an aluminum alloy, the piston may be formed to have a relatively weak hardness. In this case, when the second surface treatment part having a relatively high hardness is formed directly on the outer surface of the piston, stress may be transferred to the piston, thus causing a deformation in the piston. Therefore, according to embodiments disclosed herein, these problems may be solved by providing the first surface treatment part.

As the DLC has excellent hardness and self-lubrication and has a low friction coefficient, the second surface treatment part may prevent abrasion of the piston in the action with the cylinder. Also, as the first and second surface treatment parts may be formed by performing the surface treatment on the piston within one chamber, the surface treatment process may be simplified and costs reduced.

Further, as the hardness of the surface treatment part of the piston is sufficiently large as compared with the surface hardness of the inner circumferential surface of the cylinder, it is possible to prevent an occurrence of abrasion on the piston during the reciprocating motion of the piston. Furthermore, as the filter device capable of filtering the refrigerant used as the gas bearing is provided, it is possible to prevent a foreign substance or oil from being introduced into the cylinder nozzle. As a result, as it is possible to prevent the cylinder nozzle from being clogged, the action of the gas bearing between the cylinder and the piston may be effectively achieved, thereby preventing abrasion of the cylinder and the piston.

Embodiments disclosed herein provide a linear compressor which prevents abrasion of a piston, which is caused by friction of the piston or cylinder during operation of the linear compressor, and a method for manufacturing a linear compressor. Embodiments also provide a linear compressor which prevents abrasion of a piston during an initial operation of the linear compressor.

Embodiments disclosed herein provide a linear compressor in which a plurality of surface treatment processes may be performed within one work space (chamber), and a method for manufacturing a linear compressor. Embodiments disclosed herein further provide a linear compressor in which there is proposed a surface treatment method capable of stably forming two surface treatment parts or treatments on an outer circumferential surface of a piston and having an excellent coupling force, and a method for manufacturing a linear compressor.

Embodiments disclosed herein provide a linear compressor in which an optimal thickness capable of improving a function of two surface treatment parts is proposed, and a method for manufacturing a linear compressor. Embodiments disclosed herein also provide a linear compressor which performs a process capable of reducing a rate of defective products together with the surface treatment processes, and a method for manufacturing a linear compressor.

Embodiments disclosed herein provide a piston of a linear compressor that may include a surface treatment body made of aluminum or an aluminum alloy; a first surface treatment part or treatment provided on an outer surface of the surface treatment body by a first vacuum deposition process; and a second surface treatment part or treatment provided on an outer surface of the first surface treatment part by a second vacuum deposition process. A hardness of the second surface treatment part may be greater than a hardness of the first surface treatment part.

The first surface treatment part may include chromium nitride (CrN). The second surface treatment part may include diamond-like carbon (DLC).

The first vacuum deposition process may include sputtering. The second vacuum deposition process may include a plasma enhanced chemical vapor deposition (PECVD) process.

A thickness of the second surface treatment part may be greater than a thickness of the first surface treatment part. The thickness of the first surface treatment part may be in a range of about 1.4 µm to about 2.4 µm, and a thickness of the second surface treatment part may be in a range of about 2.1 µm to about 3.7 µm.

The linear compressor may include a discharge valve that selectively opens a compression space of the cylinder, and a cylinder nozzle which is defined in the cylinder and through which a refrigerant discharged through the discharge valve may be supplied to an inner circumferential surface of the cylinder. The linear compressor may further include a frame coupled to an outer side of the cylinder, and a gas hole which may be defined in the frame and through which a refrigerant discharged through the discharge valve may be supplied to the cylinder nozzle.

Embodiments disclosed herein further provide a method for manufacturing a linear compressor that may include forming a piston; installing the piston on a jig; forming a first surface treatment part or treatment on an outer surface of the piston using a first plasma generator; and forming a second surface treatment part or treatment on an outer surface of the first surface treatment part using a second plasma generator. The forming of the first surface treatment part and the forming of the second surface treatment part may be performed within one chamber.

A sputtering process may be performed using the first plasma generator. The first plasma generator may include chromium (Cr) and nitrogen gas ($N_2$), and ionized chromium and ionized nitrogen may be bonded to each other and coated on the outer surface of the piston.

A plasma enhanced chemical vapor deposition (PECVD) process may be performed using the second plasma generator. A second plasma generator may include acetylene ($C_2H_2$) gas, and ionized carbon (C) may be coated on the outer surface of the first surface treatment part.

The details of one or more embodiments are set forth in the accompanying drawings and the description. Other features will be apparent from the description and drawings, and from the claims.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A linear compressor, comprising:
   a piston inserted into a cylinder and reciprocating within the cylinder, wherein the piston includes:
   a surface treatment body made of aluminum or an aluminum alloy;
   a first surface treatment provided on an outer surface of the surface treatment body, by a first vacuum deposition process; and
   a second surface treatment provided on an outer surface of the first surface treatment, by a second vacuum deposition process, a hardness of the second surface treatment being greater than a hardness of the first surface treatment, wherein the first surface treatment includes a plurality of surface treatments which includes:
   a third surface treatment formed by depositing chromium nitride, the third surface treatment being provided on the surface treatment body; and
   a fourth surface treatment made of a nickel-phosphorus alloy, the fourth surface treatment being provided on the third surface treatment, and wherein the second surface treatment includes diamond-like carbon provided on the fourth surface treatment, and
   wherein a thickness of the surface treatment body is in range of substantially 2.5 mm to 3 mm, a thickness of the first surface treatment including the third surface treatment and the fourth surface treatment is in range of substantially 1.4 µm to 2.4 µm, and a thickness of the second surface treatment is greater than the thickness of the first surface treatment and in range of substantially 2.1 µm to 3.7 µm.

2. The linear compressor according to claim 1, wherein the first vacuum deposition process includes sputtering.

3. The linear compressor according to claim 2, wherein the second vacuum deposition process includes a plasma enhanced chemical vapor deposition process.

4. The linear compressor according to claim 1, further including:
   a discharge valve that selectively opens a compression space of the cylinder; and
   a cylinder nozzle defined in the cylinder and through which a refrigerant discharged through the discharge valve is supplied to an inner circumferential surface of the cylinder.

5. The linear compressor according to claim 4, further including:
   a frame coupled to an outer side of the cylinder; and
   a gas hole defined in the frame and through which the refrigerant discharged through the discharge valve is supplied to the cylinder nozzle.

6. The linear compressor according to claim 1, wherein a cylinder surface treatment made of an anodizing layer is provided on an inner circumferential surface of the cylinder.

7. The linear compressor according to claim 5, further including a gas inflow defined in the cylinder and through which the refrigerant discharged from the gas hole is supplied to the cylinder nozzle.

8. The linear compressor according to claim 7, wherein the gas inflow is recessed inward from an outer circumferential surface of the cylinder in a radial direction, and wherein the gas inflow has a circular shape along the outer circumferential surface of the cylinder with respect to a central axis in an axial direction.

9. The linear compressor according to claim 8, further including a cylinder filter provided in the gas inflow, wherein the cylinder filter prevents a foreign substance having a size greater than or equal to a predetermined size.

10. The linear compressor according to claim 9, wherein the predetermined size is about 1 µm.

11. The linear compressor according to claim 8, wherein the cylinder filter includes a thread wound around the gas inflow.

12. The linear compressor according to claim 11, wherein the thread is made of a polyethylene terephthalate material having a predetermined thickness.

13. The linear compressor according to claim 8, wherein the cylinder nozzle extends inward from the gas inflow in the radial direction up to the inner circumferential surface of the cylinder.

14. The linear compressor according to claim 4, wherein the refrigerant is supplied through the cylinder nozzle between the inner circumferential surface of the cylinder and an outer circumferential surface of the piston.

15. The linear compressor according to claim 1, wherein the piston includes at least one suction hole provided in a front end surface of the piston, and a coupling hole provided in a central portion of the front end surface of the piston.

16. The linear compressor according to claim 15, further including a suction valve coupled to the coupling hole using a valve coupling member, wherein the suction valve selectively covers the at least one suction hole.

\* \* \* \* \*